United States Patent [19]

Tamba

[11] Patent Number: 5,594,383

[45] Date of Patent: Jan. 14, 1997

[54] ANALOG FILTER CIRCUIT AND SEMICONDUCTOR INTEGRATED CIRCUIT DEVICE USING THE SAME

[75] Inventor: Yuko Tamba, Ohme, Japan

[73] Assignee: Hitachi, Ltd., Tokyo, Japan

[21] Appl. No.: 370,660

[22] Filed: Jan. 10, 1995

[30] Foreign Application Priority Data

Jan. 12, 1994 [JP] Japan .................................. 6-001747

[51] Int. Cl.$^6$ ............................. H03B 1/00; H03K 5/00
[52] U.S. Cl. ........................... 327/552; 327/563; 330/253; 330/257; 330/296
[58] Field of Search .................................. 327/345, 552, 327/553, 551, 253, 560, 561, 562, 563; 330/257, 288, 295, 296, 129, 133, 136, 252, 253, 261

[56] References Cited

U.S. PATENT DOCUMENTS

| | | | |
|---|---|---|---|
| 4,926,139 | 5/1990 | Anderson et al. | 327/552 |
| 5,200,716 | 4/1993 | Amano | 327/553 |
| 5,317,216 | 5/1994 | Hosoya et al. | 327/552 |
| 5,317,217 | 5/1994 | Rieger et al. | 327/555 |
| 5,357,208 | 10/1994 | Nelson | 327/553 |

FOREIGN PATENT DOCUMENTS

| | | |
|---|---|---|
| 254323 | 1/1988 | European Pat. Off. . |
| 355906 | 2/1990 | European Pat. Off. . |
| 9300550 | 4/1993 | Germany . |

OTHER PUBLICATIONS

R. Klinke et al, "CMOS Operational Amplifier with Nearly Constant Settling Time", IEE Proceedings, vol. 137, Pt. G, No. 4, Aug. 1990, pp. 309–314.

R. P. Martins et al, "An Optimum CMOS Switched–Capacitor Antialiasing Decimating Filter", IEEE Journal of Solid-State Circuits, Sep. 1993, vol. 28, No. 9, pp. 962–970.

B. A. Blow et al, "A Dual Frequency Range Integrated Circuit Accelerometer Using Capacitive and Piezoelectric Sensing Techniques", 1993 IEEE International Symposium on Circuits and Systems, vol. 2 or 4, May 1993, pp. 1120–1123.

Technical Investigation Report by Electron Information Communication Meeting, vol. 92, No. 115, ICD92-30, pp. 33–39, and English translation.

IEEE Journal of Solid State Circuits; vol. 25, No. 6, Dec. 1990, pp. 1368–1378.

IEEE Journal of Solid State Circuits; vol. 25, No. 1, Feb. 1990, pp. 315–317.

*Primary Examiner*—Timothy P. Callahan
*Assistant Examiner*—My-Trang Nu Ton
*Attorney, Agent, or Firm*—Fay, Sharpe, Beall, Fagan, Minnich & McKee

[57] ABSTRACT

A Gm-controllable amplifier is used in an OTA-C filter. Specifically, the amplifier is one in which a constant voltage from a bias circuit is applied to the gates of load MOSFETs connected to the drains of input differential MOSFETs of a differential amplifier to allow the load MOSFETs to operate as constant current sources and the inverted output terminals of the circuit are connected to the input terminals. The load MOSFETs of the input differential MOSFETs are made to operate as the constant current sources, so that the drain voltages of the input differential MOSFETs become independent of the threshold voltage of the load MOSFETs. Even if the supply voltage is set to as low as about 1.5 V, the input differential MOSFETs can be prevented from being unsaturated when the input signals rise. Since the inverted output terminals are coupled to the input terminals, the currents outputted from the inverted output terminals in the opposite direction of the current coming from the non-inverted output terminals can be absorbed from the non-inverting input terminals, so that the balance of the circuit can be easily maintained.

21 Claims, 14 Drawing Sheets

ANALOG FILTER CIRCUIT AND SEMICONDUCTOR INTEGRATED CIRCUIT DEVICE USING THE SAME

BACKGROUND OF THE INVENTION

The present invention relates to an analog signal processing technique and, more particularly, to a technique which is especially effective when applied to an analog filter circuit using a differential amplifier whose transconductance is controllable. This technique is effective when applied to a semiconductor integrated circuit device (hereinafter also referred to as an LSI) having an analog filter circuit therein and used in a device such as a portable telephone operating on a low voltage.

In recent years, as portable telephones and battery-operated electronic devices (e.g., notebook computers and cassette tape recorders) have become popular, a demand of lowering the voltage and reducing the power consumption of an LSI has been rising so as to further reduce the size and weight of the devices and to prolong the service life of the device with small-sized batteries.

On the other hand, digitalization has become more prevalent in the communications and audio fields. Since, however, the voices, images and electric waves processed are analog signals, analog circuits are indispensable. In signal processing for digital communications, moreover, A-D converters, D-A converters and analog filters, which are disposed before and after the converters so as to remove aliasing noises and high-frequency components are required.

SUMMARY OF THE INVENTION

Since, the performance of analog circuits highly depends upon the power supply voltage, it is necessary to find a way of lowering the voltage. Particularly, the key techniques are A-D and D-A converters and the filter circuit, and current-driven A-D and D-A converters are now under development. Therefore, another major problem left unsolved is to realize a filter circuit which operates on a low voltage with a low power consumption and has little frequency deviation.

Example of analog filter circuits include a CR filter using a resistor R and a capacitor C and a switched capacitor filter in which the resistor of the CR filter is replaced by a switch. The CR filter is a continuous-time filter, and the cut-off frequency fc (the frequency at a gain of −3 dB) is expressed by $1/2\pi RC$, so that the cut-off frequency fc varies ±50% at the maximum due to production variation (±30%) of the resistor R and the production variation (±20%) of the capacitor C. We have found out that the CR filter has a problem that frequency deviation is very bad.

On the other hand, the switched capacitor filter is a discrete-time filter, and the cut-off frequency fc is expressed by $fs \cdot C1/C2$ where fs is a sampling frequency. Since the cut-off frequency fc of the switched capacitor filter is thus determined by the sampling frequency and the capacity ratio of the capacitor used in the filter, the switched capacitor-filter exhibits remarkably excellent characteristics in the frequency deviation. However, we have found that another problem is that a high-speed amplifier is required which can follow a frequency ten times higher or more than the signal frequency.

Moreover, the switched capacitor filter requires a continuous-time front- and back-end filters, so that it is not suitable for reducing the power consumption. The MOSFETs constituting switches are not turned on if the supply voltage is low, so that it is not also suited for lowering the voltage. In this case, a method of boosting the clocks for turning on and off the switches can be considered. However, the so-called "feed-through", in which the gate voltage is transmitted to the source or drain through a parasitic capacitor between the gate and the source or between the gate and the drain, increases and deteriorates the SN ratio (Signal-to-Noise ratio).

As an example of an analog filter circuit capable of operating on a low voltage with a power consumption, moreover, there has been proposed an operational transconductance amplifier-capacitor (hereinafter also referred to as an OTA-C) filter, as shown in FIG. 19, in which a differential amplifier circuit (Operational Transconductance Amplifier, hereinafter also referred to as an OTA) whose transconductance Gm (the voltage-current conversion characteristic) is controllably used in place of the resistors of the CR filter. The OTA-C filter has an advantage that the cut-off frequency fc is expressed by $Gm/2\pi C$ and the deviation of the cut-off frequency fc can be compensated by adjusting the transconductance Gm of the differential amplifier in accordance with the amount of variation of the capacitance C. According to our study, however, the distortion of the OTA-C filter cannot be limitted to below 0.2%, so that it does not satisfy the practical requirement.

Therefore, we have investigated the cause that the operating voltage of the OTA-C filter cannot be lowered. The Gm-controllable amplifier used in the OTA-C filter comprises a differential amplifier, as shown in FIG. 18. Then, it can be considered that the transconductance Gm is adjusted by adjusting the gate voltage Vc of a constant current MOSFET M5 to change a bias current Ic.

In the basic circuit of FIG. 18, the gate of a MOSFET M1 connected as a load to the drain terminal of an input differential MOSFET M3 is connected to the drain. In short, the MOSFET M1 is, so-called, diode-connected. As a result, in cases where the supply voltage VDD is low, and the voltage Ve (the difference of Vgs-Vth between the gate-source voltage Vgs and the threshold voltage Vth of the MOSFET M3) and the threshold voltages of the P-MOSFETs M1 and M2 are high, the voltage at a node N1, i.e., the drain voltage of the MOSFET M3 drops, causing the MOSFET M3 to be unsaturated when the input signal Vin rises. Our investigations have reached a conclusion that the above process is the reason that a low-voltage OTA-C filter cannot be realized. If the MOSFETs operate in an unsaturated range, distortion will arise in the change in the output signal due to the change in the input signal. If, in the OTA, the MOSFETs also operate in an unsaturated range, the straightness (linearity) between the input voltage and the output voltage is deteriorated.

The present invention has been achieved against the background described above and has an object to provide a filter circuit which operates on a low voltage with a low power consumption and has a low distortion and a small frequency deviation.

Another object of the present invention is to provide a filter circuit which is suitable for an LSI having a digital circuit mixed with an analog circuit.

Still another object of the present invention is to provide a differential amplifier having a stable transconductance.

A further object of the present invention is to provide a low voltage/low power consumption LSI.

The aforementioned and other objects and novel features of the present invention will become apparent from the following description to be made hereinafter with reference to the accompanying drawings.

A representative of the invention to be disclosed herein will be summarized as follows.

A Gm-controllable amplifier used in an OTA-C filter is so structured that a constant voltage from a bias circuit is applied to the gates of load MOSFETs connected to the drains of input differential MOSFETs of a basic differential amplifier to allow the load MOSFETs to operate as constant current sources and by connecting the inverted output terminals of the circuit to the input terminals of the differential amplifier.

More preferably, the differential amplifier is equipped with a current compensation type bias generator for generating a bias voltage corresponding to the level of the input voltage monitored, and applying the bias voltage to the gates of constant current MOSFETs of the differential amplifier, so as to compensate the current fluctuation due to the channel length modulation effect.

By the aforementioned means, the MOSFETs acting as the loads of the input differential MOSFETs are made to operate as constant current sources, so that the drain voltages of the input differential MOSFETs become independent of the threshold voltage of the constant current type load MOSFETs. Even if the supply voltage is set to as low as about 1.5 V, the input differential MOSFETs can be prevented from being unsaturated when input signals rise. If, moreover, the differential amplifier has a single-ended output structure where the output voltage only from the non-inverted output terminals, the current outputted from the inverted output terminals and flowing in the opposite direction to the non-inverted output terminals is absorbed by changing the drain voltage of the input differential MOSFETs, and accordingly the circuit balance cannot be maintained. If, however, the inverted output terminals are connected to the input terminals, the currents outputted from the inverted output terminals and flowing in the opposite direction to the non-inverted output terminals can be absorbed from the non-inverting input terminals, so that the balance of the circuit can be easily maintained. Moreover, since the drain voltage of the input differential MOSFETs similarly fluctuates, the symmetry can be improved to reduce the distortion.

Since, furthermore, the current fluctuation due to the channel length modulation effect that the pinch-off point of a MOSFET approaches the source to increase the drain current when the drain-source voltage rises, can be compensated, the bias current of the differential amplifier is constant, stabilizing the transconductance and reducing the output distortion.

DESCRIPTION OF THE PREFERRED EMBODIMENTS

Figure 1:
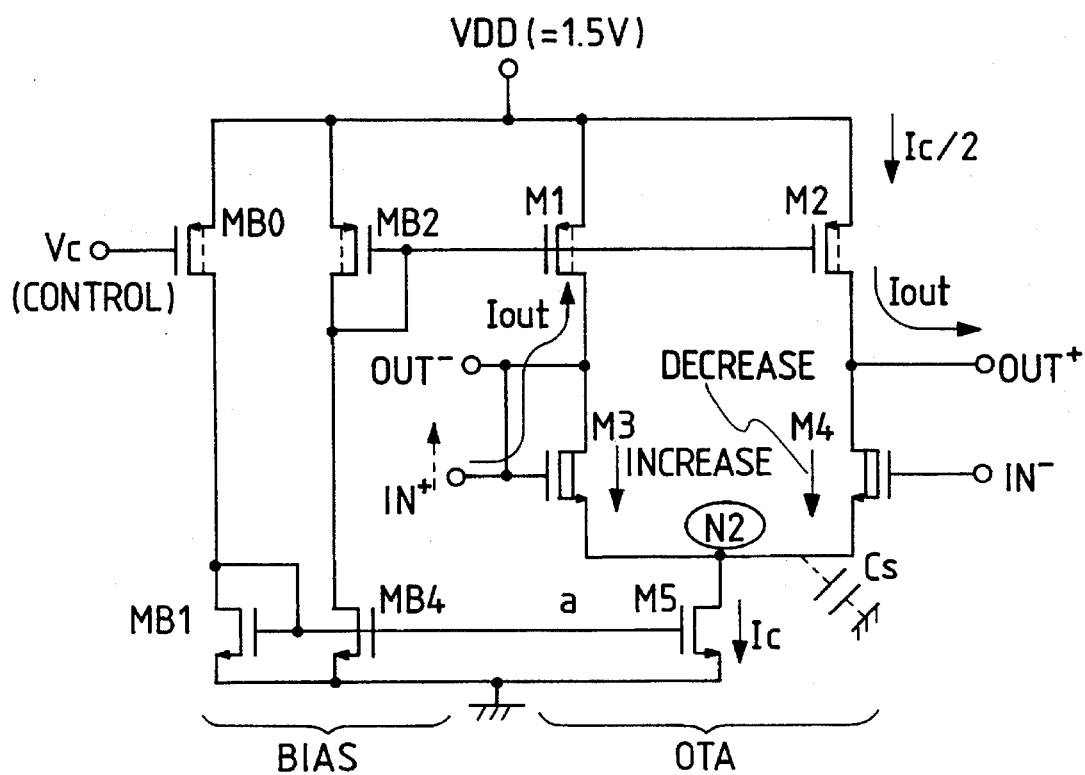
FIG. 1 is a circuit diagram showing one embodiment of a Gm-controllable differential amplifier according to the present invention.
Figure 2:
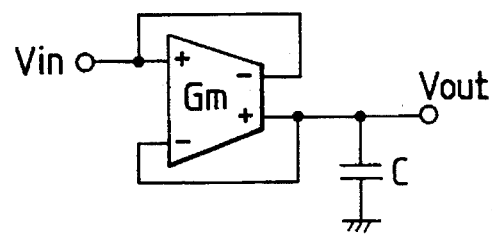
FIG. 2 is a circuit structural diagram showing an example of a primary low-pass filter using the differential amplifier of FIG. 1.

FIGS. 1 and 2 show one embodiment of a Gm controllable differential amplifier according to the present invention and an OTA-C filter using the amplifier. Here in the Figures, MOSFETs (e.g., M3, M4 and M5) having arrows directed outward from their gate terminals is of an N-channel type, whereas MOSFETs (e.g., M1 and M2) having arrows directed to their gate terminals is of a P-channel type.

The differential amplifier of the embodiment includes a differential amplifier stage OTA and a bias circuit BIAS. The differential amplifier stage OTA comprises input differential MOSFETs M3 and M4, load MOSFETs M1 and M2 made to serve as constant current sources and connected to the drains of the input operational MOSFETs M3 and M4 and constant current MOSFET M5. The gate bias voltage of the load MOSFETs M1 and M2 is generated by the bias circuit BIAS. Moreover, this bias circuit BIAS is provided for generating the gate bias voltage of the MOSFETs M1 and M2. This bias circuit BIAS also generates the gate bias voltage of the constant current MOSFET M5 which is connected to the common source of the input operational MOSFETs M1 and M2. In other words, the connections are so made that the source-drain path of the input differential MOSFET M3 (M4) is connected in series to the source-drain path of the load MOSFET M1 (M2) and further in series to the source-drain path of the constant current MOSFET M5.

In the differential amplifier of the embodiment, the amplitude of an input signal Vin for the MOSFETs M1 to M5 to operate in the saturated region is not dependent upon the threshold voltage Vthp of a P-channel type load MOSFET, because it melts the following conditions, so that the voltage can be lowered:

$$2Ve+Vthn<Vin<VDD-Ve.$$

Here, the voltage Ve is a difference (Vgs–Vthn) between a gate-source voltage Vgs of the MOSFETs M3 and M4 and the threshold voltage Vthn of the same MOSFETs, and the amplitude of the input signal Vin takes a value of 0.31V if the voltage Vthn is 0.25 V.

In the differential amplifier of the embodiment, on the other hand, a current Iout flowing from the output terminal out+ is a half of that of the circuit of the prior art. Hence, the transconductance Gm is expressed by the following Equation:

$$Gm = Iout/\Delta Vin = \sqrt{(Ic \cdot \beta \cdot W/L)} \quad /2.$$

Here, $\beta$, W and L designates the values which are determined by the MOSFETs M3 and M4. The value $\beta$ is the channel conductance of the MOSFET; L is a channel length along the channel; and W is the channel width in the direction orthogonal to the channel.

In the differential amplifier of the embodiment, however, a problem rises in the current Iout– which is outputted from an inverted output terminal out– and flows in the direction reverse to that of the aforementioned current Iout. If there is no part to which the current Iout– is fed, it tends to be absorbed by the change of the drain voltage of the MOSFET M3, so that the voltage of the inverted output terminal out– greatly fluctuates and the balance of the circuit cannot be kept. In this case, there is used a differential output method in which a capacitor is connected between the inverted output terminal out– and a non-inverted output terminal out+. In the filter circuit of the present application, it is desirable that the differential amplifier has a single-ended output. In the differential amplifier of the embodiment, therefore, a non-inverting input terminal (in+) and the inverted output terminal (out–) are connected so that the current (Iout) flowing in the direction opposite to that of the non-inverted current outputted from the non-inverted output terminal (out–) may be absorbed from the non-inverting input terminal (in+).

Here will be described the bias circuit BIAS.

The bias circuit BIAS in the differential amplifier comprises: MOSFETs MB0 and MB1 connected in series between the supply voltage VDD and the ground potential, and MOSFETs MB2 and MB4 also connected in series between the supply voltage VDD and the ground potential. The MOSFET MB1 on the ground potential side constitutes a current mirror circuit in which the gate and drain are connected to apply the drain voltage to the gates of the MOSFETs MB1, MB2 and MOSFET M5 current supply of the differential amplifier stage OTA.

Moreover, the MOSFET MB2 of the bias circuit BIAS is structured as a diode-connected circuit, in which the gate and drain are connected to apply the drain voltage to the gate terminals of the aforementioned constant current type load MOSFETs M1 and M2 of the differential amplifier stage OTA. The Gm of the differential amplifier state OTA is controlled by applying a Gm controlling control voltage Vc to the gate of the MOSFET MB0 of the bias circuit BIAS and by feeding a bias current according to the level of the voltage Vc to the constant current MOSFETs M1, M2 and M5.

Specifically, as the level of the Gm controlling control voltage Vc rises, the current of the MOSFET MBO is reduced to lower the gate voltage of the current-mirror connected MOSFETs MB1, MB4 and MB5, and thereby to reduce the bias current of the differential amplifier stage. As the level of the Gm controlling control voltage Vc drops, on the other hand, the current of the MOSFET MB0 increases to raise the gate voltage of the current-mirror connected MOSFETs MB1, MB4 and MB5, and thereby to increase the bias current of the differential amplifier stage.

Moreover, the embodiment is so constructed that even if the supply voltage VDD is set to a voltage as low as 1.5 V, the bias voltage to prevent the input differential MOSFETs M3 and M4 from becoming unsaturated in response to the input signal Vin of 0.91 V to 1.22 V is produced by the aforementioned bias circuit BIAS and is applied to the gates of the constant current type load MOSFETs M1 and M2.

As a result, in a circuit simulation using a 0.8 µm analog-digital process model parameter the distortion caused by the circuit system of the embodiment was able to be reduced to 0.12% in the primary filter (cut-off frequency fc=30 KHz) when the supply voltage was 1.5 V, the input signal was 1.05±0.15 V and the input frequency was 10.5 KHz.

Incidentally, in the differential amplifier of the embodiment, the distortion is 0.02% if the MOSFETs M1, M2 and M5 are assumed to be an ideal current source. It is therefore deduced that the distortion (0.12%) of the aforementioned simulation results from the fact that the drain voltages of the MOSFETs M1, M2 and M5 fluctuate according to the changes in the input/output signals, and the current is changed by the channel length modulation effect.

In this embodiment, therefore, the fluctuations of the drain voltages due to the channel length modulation effect are suppressed to reduce the output distortion of the differential amplifier by setting the channel lengths of the aforementioned MOSFETs M1, M2 and M5 to about 6 µm.

Figure 3:
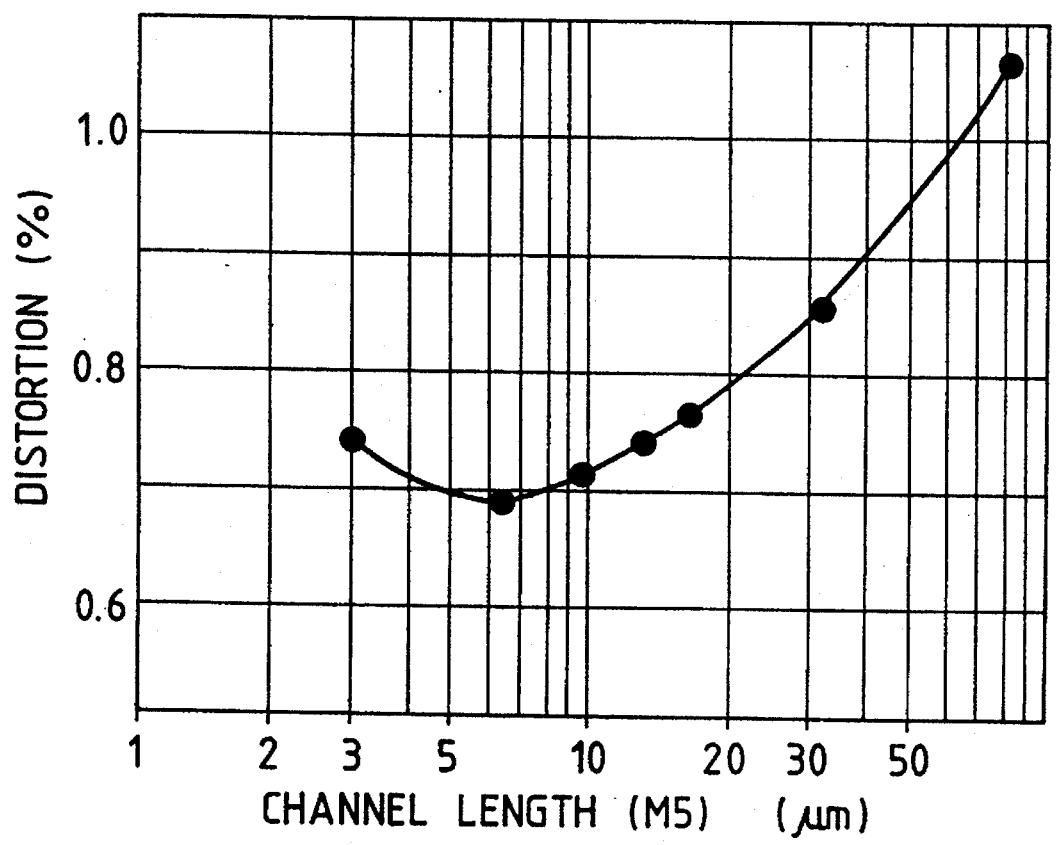
FIG. 3 is a graph showing the dependency of the distortion on a channel in the differential amplifier of FIG. 1.

FIG. 3 shows the relation between the distortion of the differential amplifier and the channel length of the MOSFET M5. Here, FIG. 3 shows the result of measurement which is obtained setting the ratio W/L of the channel width to the length to a constant so that a current of identical magnitude may flow through the MOSFET M5.

It is known in the prior art that the channel length modulation effect of a MOSFET can be lowered by increasing the channel length. However, our investigations have revealed that in a differential amplifier the output distortion is minimized for the channel length of about 6 µm of the MOSFET M5 but degraded for the larger channel length. This is because although an increase in the channel length will reduce the amplitude of the current error due to the channel length modulation effect, the parasitic capacitance Cs (the drain capacitance of M5) applied to a node N2 of the circuit of FIG. 1 increases to augment the current error due to the current flowing through the parasitic capacitor Cs. From the above description, it is understood that it is advantageous that for the differential amplifier of FIG. 1 N-channel type MOSFETs M3, M4 and M5 having large $\beta$ (channel conductance) values be used.

Figure 4:
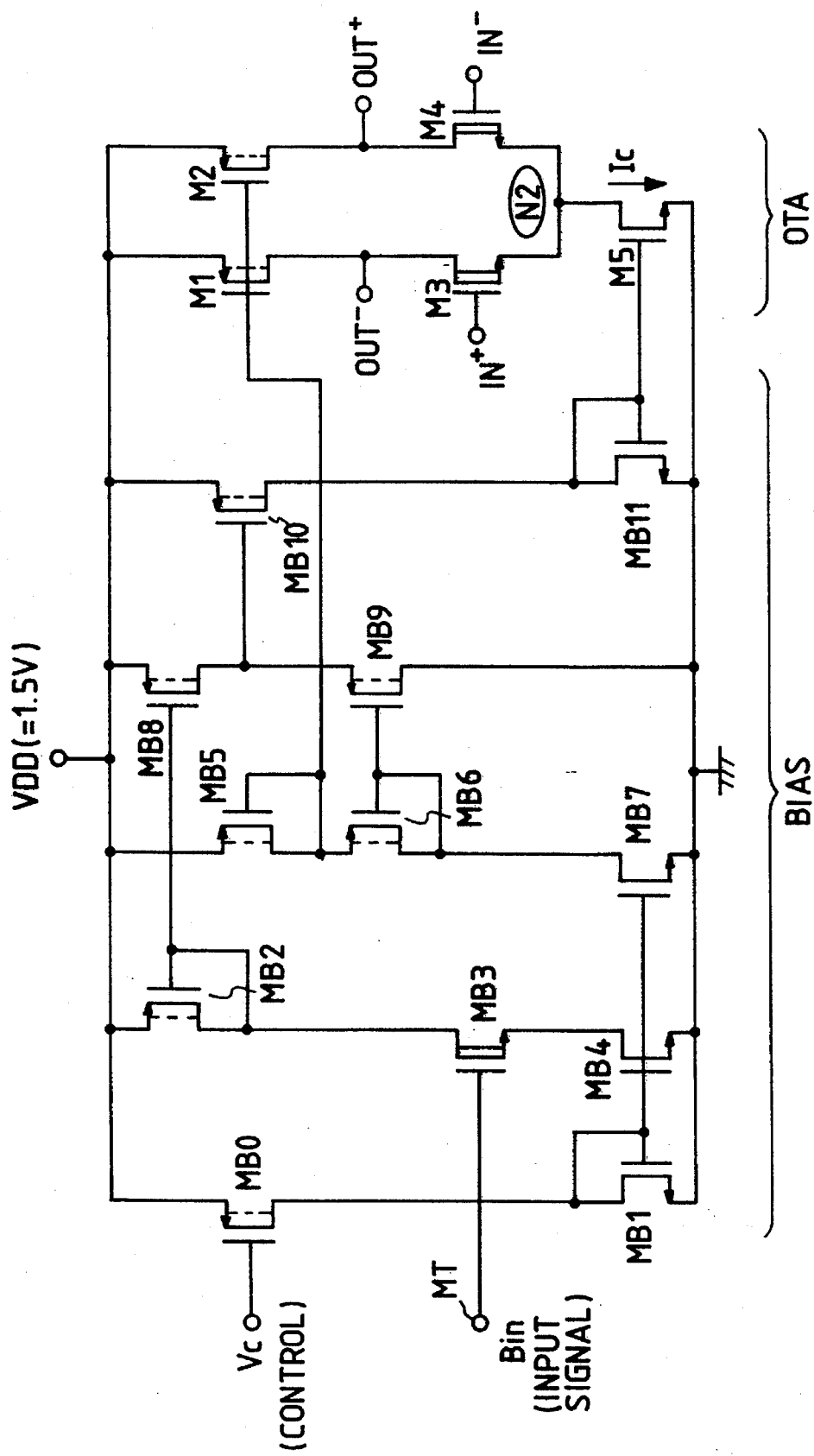
FIG. 4 is a circuit diagram showing a second embodiment of a Gm controllable differential amplifier according to the present invention.
Figure 5:
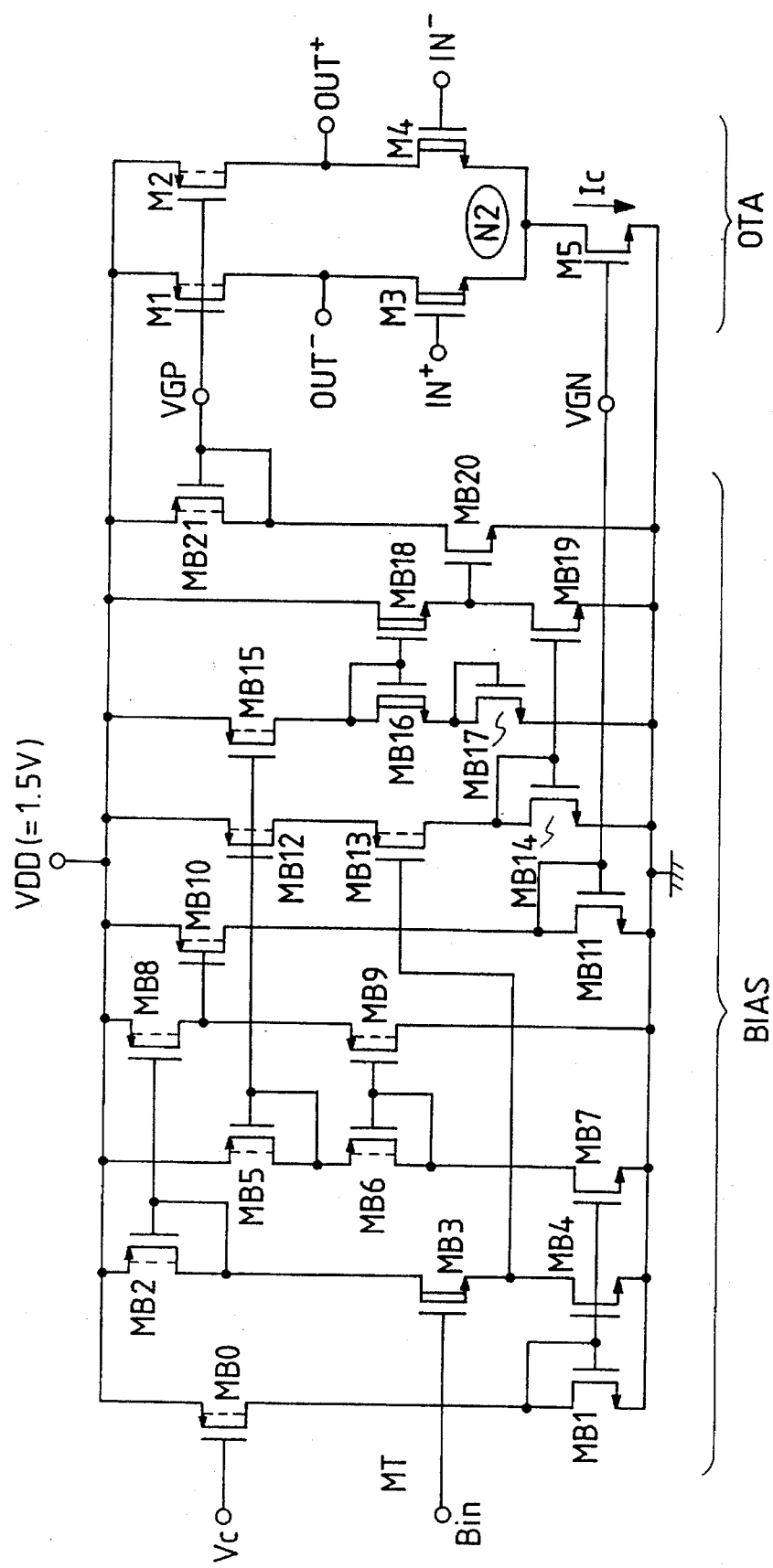
FIG. 5 is a circuit diagram showing a third embodiment of a Gm controllable differential amplifier according to the present invention.

FIGS. 4 and 5 show second and third embodiments a Gm-controllable differential amplifier according to the present invention and an OTA-C filter using the amplifier. In FIG. 4 showing the second embodiment, the elements designated by the same labels as those of FIG. 1, are the identical elements.

The distortion of the differential amplifier of this embodiment is further reduced by improving the circuit of the embodiment of FIG. 1 so that the current of the constant current MOSFET M5 may be compensated according to the change in the input signal. In the circuit of FIG. 1, as the input voltage lowers, the potential of the node N2 accordingly lowers to decrease the current of the MOSFET M5. As the input voltage rises, the potential of the node N2 accordingly rises to increase the current of the MOSFET M5. In the circuit of FIG. 4, therefore, the bias circuit BIAS is so improved that the gate voltage of the MOSFET M5 is raised or lowered to compensate for the current increase or decrease of the aforementioned MOSFET M5 so that the current may be held at a constant value.

Specifically, to the constant current MOSFET M5 of the differential amplifier OTA, there is connected in a current mirror manner a MOSFET MB11 which is disposed in the bias circuit BIAS. To the MOSFET MB1 fed with a current according to the control voltage Vc, and also to the MOSFET MB4, there is connected in a current-mirror manner MOSFETs MB5, MB6 and MB7 which are connected in series between the supply voltage VDD and the ground potential.

Between the MOSFETs MB2 and MB4 connected in series between the supply voltage VDD and the ground potential, there is connected a MOSFET MB3 adapted to receive the input signal at its gate terminal. To the MOSFET MB2, moreover, there is connected in a current mirror manner a MOSFET MB8 whose source terminal is connected to the supply voltage VDD. Between the drain terminal of the MOSFET MB8 and the ground potential, there is connected a MOSFET MB9 which is connected in a current mirror manner to the aforementioned MOSFET MB6. To the drain terminal of the MOSFET MB8, there is connected the gate terminal of a MOSFET MB10 which is connected in series to the MOSFET MB11.

In FIG. 5 showing the third embodiment, the elements designated by the same labels as those of FIG. 4, are the identical elements.

Next, will be described the portions different from those of the circuit of FIG. 4.

In the third embodiment, furthermore, unlike the second embodiment, the aforementioned MOSFET MB5 is connected in a current mirror manner to MOSFETs MB12 and MB15. Between the drain terminal of the MOSFET MB12 of the two and the ground potential, there are connected in series a MOSFET MB13 whose gate terminal receives the source voltage of the MOSFET MB3, and a diode-connected MOSFET MB14. Between the drain terminal of the MOSFET MB15 and the ground potential, there are connected in series diode-connected MOSFETs MB16 and MB17 which form a series of MOSFETs in contrast to the series of the MOSFETs MB5, MB6 and MB7.

To the MOSFET MB16, furthermore, there is connected in a current mirror manner the MOSFET MB18, of the MOSFETs MB18 and MB19 which are connected in series between the supply voltage VDD and the ground potential. The MOSFET MB19 is connected in a current mirror manner to the MOSFET MB14. To the connecting nodes of these MOSFETs MB18 and MB19, there is connected the gate terminal of a MOSFET MB20. Between the drain terminal of the MOSFET MB20 and the supply voltage VDD, there is connected a diode-connected MOSFET MB21, to which is connected in to current mirror manner the constant current type load MOSFETs M1 and M2 of the differential amplifier.

Figure 6:
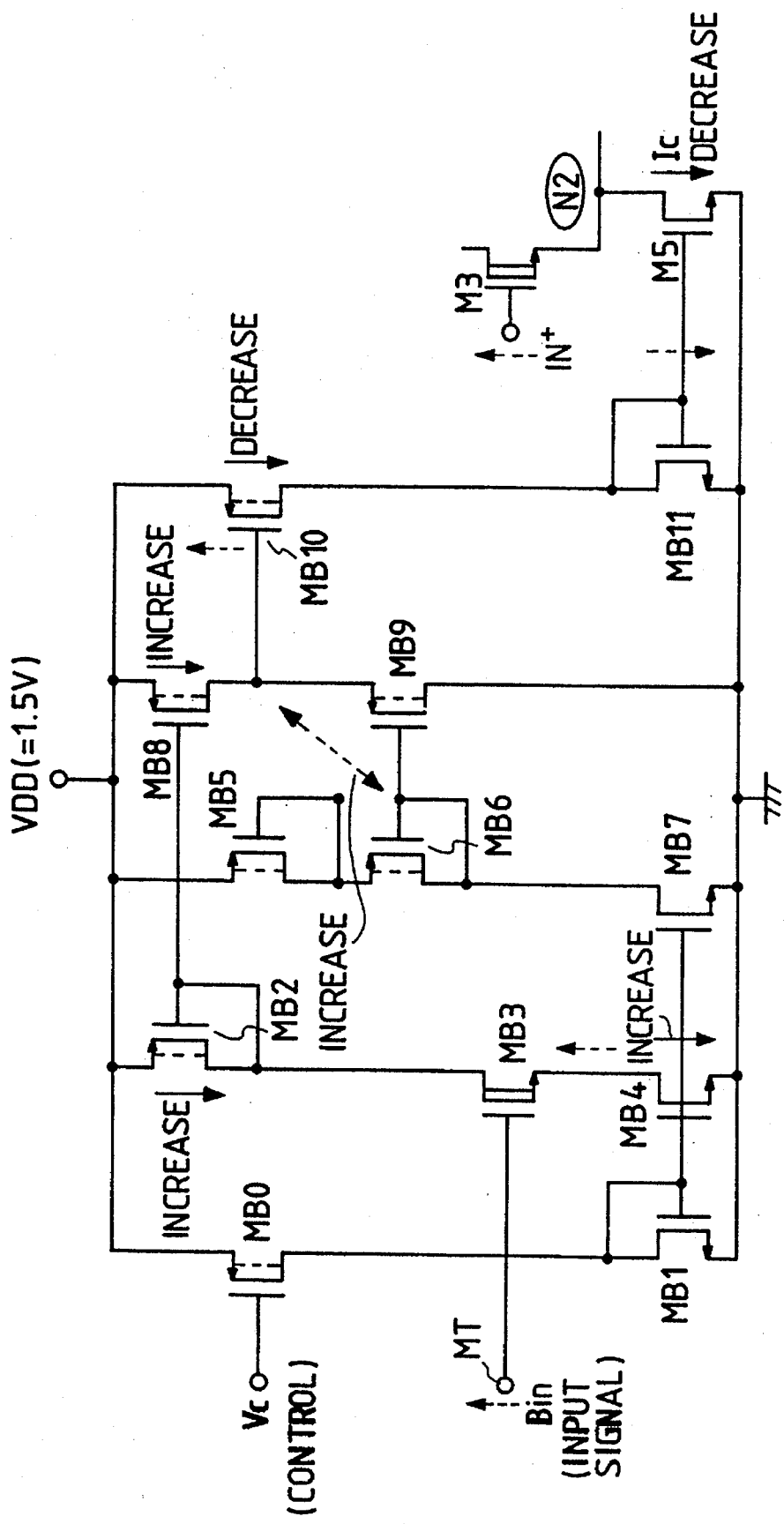
FIG. 6 is a circuit diagram for explaining the operation of a bias circuit of the differential amplifier of FIG. 4.

With reference to FIG. 6, here will be described the current compensating operation on the side of the constant current MOSFET M5 by the bias circuit.

In this embodiment, the bias circuit is equipped with a monitor terminal MT for an input signal Bin, to which is connected the gate terminal of the MOSFET MB3 through which a constant current is made to flow by the constant current MOSFET MB4. As a result, the MOSFET MB3 acts as a pseudo input MOSFET, and the source voltage changes with the change of the input signal Bin like the potential of the node N2 of the differential amplifier (like the drain voltage of the constant current MOSFET M5). For example, when the input signal Bin rises, the source voltage of the MOSFET MB3 rises to increase the current flowing through the MOSFET MB2 connected to the drain side. Hence, the current of the MOSFET MB8 connected in a current mirror manner to the MOSFET MB2 is increased to increase the current flowing through the MOSFET MB9.

On the other hand, since a constant voltage is always applied to the MOSFET MB9 by the MOSFET MB6, the gate-source voltage Vgs rises to raise the gate voltage of the MOSFET MB10 when the current of the MOSFET MB8 increases. As a result, the currents flowing through the MOSFET MB10 and the MOSFET MB11 connected to the gate side of the MOSFET MB10 decrease, and the current flowing through the MOSFET M5 connected in a current mirror manner to the MOSFET MB11 also decreases, so that the current flowing through the MOSFET M5, which tends to increase with the rise of the potential of the node N2 by the channel length modulation effect, can be compensated. When the input signal Bin drops, on the contrary, the bias circuit operates to increase the current through the MOSFET M5, which tends to decrease by the effect of the potential at the node N2.

The current compensation of the constant current type load MOSFETs M1 and M2 of the embodiment of FIG. 5 are substantially similar to the aforementioned ones except that the potential relation is reverse. The MOSFETs MB12 and MB15 correspond to the MOSFETs MB4 and MB7; the MOSFETs MB14 nd MB19 correspond to the MOSFETs MB2 and MB8; MOSFETs MB18, MB20 and MB21 correspond to the MOSFETs MB9, MB10 and MB11; and MOSFET MB13 corresponds to the MOSFET MB3, respectively. A potential, which is lower by the voltage Vth of the MOSFET MB3 than the input signal Bin, is applied as a monitor input to the gate terminal of the MOSFET MB13 to widen the operating range of the MOSFET MB13.

Consequently, in the bias circuit of FIG. 5, for example, the gate voltage of the MOSFET MB13 rises, as the input signal Bin rises, reducing the current flowing through the MOSFET MB14 connected to the drain side of the MOSFET MB13. As a result, the current flowing through the MOSFET MB19 connected in a current mirror manner to the MOSFET MB14 decreases to reduce the current flowing through the MOSFET MB18.

With a decrease in the current flowing through the MOSFET MB19, the gate-source voltage Vgs of the MOSFET MB18 drops, but the gate voltage of the MOSFET MB20 rises. Thereby, the currents flowing through the MOSFET MB20 and the MOSFET MB21 connected to the drain side of the former are increased to augment the currents flowing through the MOSFETs M1 and M2 connected in a current mirror manner to the MOSFET MB21, and thus the currents flowing through the MOSFETs M1 and M2, which tends to decrease by the channel length modulation effect due to the rises of the output voltages out− and out+, can be compensated. When the input signal Bin drops, on the contrary, the bias circuit operates to decrease the current flowing through the MOSFETs M1 and M2, which tends to increase with the drops of the output voltages out− and out+.

In the bias circuit, as has been described above, the drain voltage of the MOSFET MB4 is fluctuated as at the drain of the constant current MOSFET M5, and the current fluctuation is transmitted from the MOSFET MB2 to the MOSFET MB8 by making use of the current mirror circuit. At the same time, the MOSFET MB9 is biased by a constant voltage. As a result, the potential at the source of the MOSFET MB9, i.e., at the gate of the MOSFET MB10 is reversely fluctuated by the current fluctuation due to the drain fluctuation of the MOSFET MB4 and is fed through the MOSFET MB11 to the gate of the constant current MOSFET M5.

As a result, the current fluctuation of the constant current MOSFET M5 by the bias circuit is reduced to 0.2%. The distortion in the primary filter, to which is applied the differential amplifier of FIG. 5 of which the currents of the constant current type load MOSFETs M1 and M2 can be also improved to 0.024%.

Figure 7:
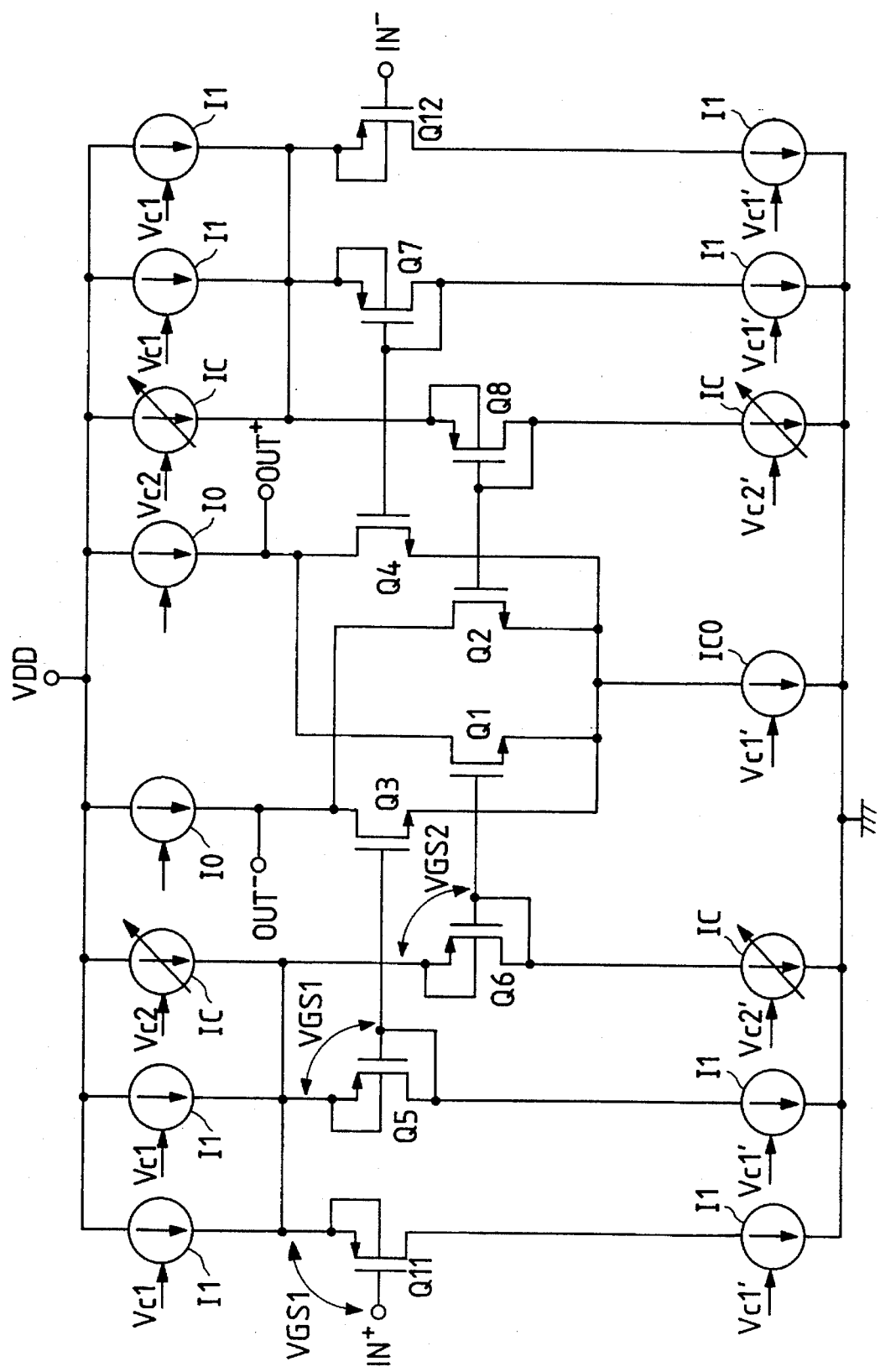
FIG. 7 is a circuit diagram showing a fourth embodiment of a Gm controllable differential amplifier according to the present invention.

FIG. 7 shows another embodiment of the Gm controllable differential amplifier which is suited for use in the OTA-C filter. The differential amplifier of FIG. 7 is improved that a differential amplifier having an excellent Gm linearity, as called cross-couple type, is suited for an OTA-C filter.

A cross-couple type differential amplifier is such that the drains of two pairs of MOSFETs Q1, Q2, and Q3, Q4 whose sources are commonly connected are commonly cross-connected to each other, constant current source I0 is connected to the common drains respectively, and signals whose dc levels are different by VB are fed to the gates of the MOSFETs Q1, Q3, and Q2, Q4. Thus, the differential amplifier of this type is characterized in that the transconductance Gm is not dependent upon the current IC0. As a result, if the W/L (the ratio of the gate width to the gate length) of the MOSFETs constituting the constant current sources IC0 connected to the common sources is designed in advance to a large value, no distortion can be generated even when the output current Iout increases by a high-frequency input.

In the cross-couple type differential amplifier, however, the gate voltages of the MOSFETs Q1, Q2, Q3 and Q4 fluctuate with the fluctuation of the threshold voltage of the VB generating MOSFETs, and thereby the input amplitude at which all the MOSFETs saturatedly operate decreases. So the cross-couple type differential amplifier is not suitable for a low-voltage filter.

In the cross-couple type differential amplifier of the embodiment of FIG. 7, at the preceding stages of the differential MOSFETs Q1, Q2, Q3 and Q4, there are provided level shifting MOSFETs Q5, Q6, Q7 and Q8 which are diode-connected. The input signals are shifted up by the source-follower type input MOSFETs Q11 and Q12, then shifted down by the MOSFETs of the same characteristics, and inputted to the differential MOSFETs Q1, Q2, Q3 and Q4.

Namely, the source voltage of the MOSFET Q11 (Q12) to the gate of which an input signal Bin+ (or Bin−) is fed is inputted to the source terminals of the diode connected MOSFETs Q5 and Q6 (Q7 and Q8), the outputs of which are extracted from their gate terminals and inputted to the gate electrodes of the differential MOSFETs Q1 and Q2 (Q3 and Q4). In the circuit of this embodiment, the difference between the lowered levels of the MOSFETs Q5 and Q6 and the difference between the lowered levels of the MOSFETs Q7 and Q8 are both set to the aforementioned voltage VB.

Constant current sources are respectively connected to the input MOSFETs Q11 and Q12 and the diode-connected MOSFETs Q5, Q6, Q7 and Q8, of which the MOSFETs Q5 and Q7, and Q11 and Q12 are connected to a constant current source I1 for supplying an equal current whereas the MOSFETs Q6 and Q8 are connected to a variable constant current source IC. In the differential amplifier of this embodiment, therefore, the input potential difference VB can be controlled to change the transconductance Gm by adjusting the current of the variable constant current source IC.

In this embodiment, on the other hand, the MOSFETs Q5 and Q6 (or Q7 and Q8) are of the source input type and have low impedances. Hence, the currents mutually flow between the MOSFETs Q11 (Q12), and Q5, Q6 (Q7, Q8) so that an expected current will not necessarily flow. In the embodiment, therefore, the currents flowing through the individual MOSFETs can be ensured by providing constant current sources to respective source and drain terminals of the MOSFETs Q11 (Q12), and Q5, Q6 (Q7, Q8).

In the embodiment of FIG. 7, the distortion can be further reduced by using the current compensation type bias circuit shown in FIG. 4 as the bias circuit for the variable constant current source IC or the constant current sources I0, I1 and IC0. In the embodiment, moreover, the differential MOSFETs Q1, Q2, Q3 and Q4 are of the N-channel type, and the input MOSFETs Q11 and Q12 and the level shifting MOSFETs Q5, Q6, Q7 and Q8 are of the P-channel type. However, they can be constituted of MOSFETs of opposite conductivity type.

The aforementioned constant current sources I1 and I0 and the variable constant current source IC can be each constructed of a single MOSFET.

Figure 8:
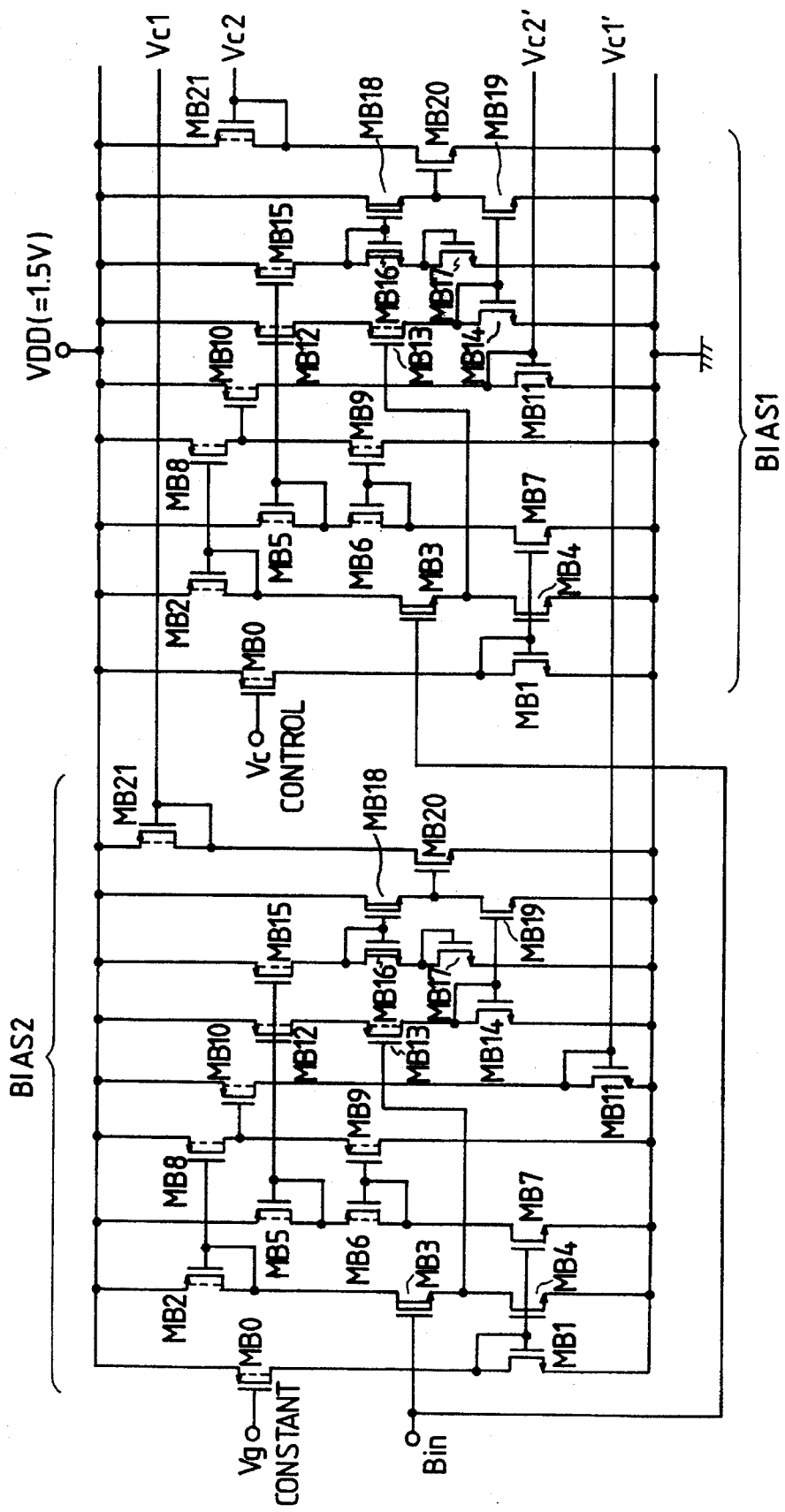
FIG. 8 is a circuit diagram showing an example of a bias circuit suitable for the differential amplifier of FIG. 7.

FIG. 8 shows an example of the bias circuit for generating the respective gate bias voltages of the current sources I1, I0 and variable constant current sources IC, in cases where they each comprise one MOSFET.

Moreover, the constant current sources connected to the sources of the MOSFETs Q5, Q11 (Q7, Q12) may be made common to each other. Likewise, the constant current sources connected to the drains of the MOSFETs Q5, Q11 (Q7, Q12) may be made common to each other.

In FIG. 8, labels BIAS2 designates a bias circuit for generating bias voltages Vc1 and Vc1' for the current sources I1 and I0, and BIAS1 designates a bias circuit for generating bias voltages Vc2 and Vc2' for the variable constant current source IC. These bias circuits have the same structure as that of the bias circuit BIAS in the embodiment of FIG. 5, and the variation of the current due to the channel length modulation effect can be compensated. In FIG. 8, the elements having the same functions as those of the elements composing the bias circuit BIAS of the embodiment of FIG. 5 are designated by the same labels, and their detailed description will be omitted.

Incidentally, the control of the transconductance Gm is accomplished by adjusting the voltage applied to the control terminal of the bias circuit BIAS1. The constant voltage Vg is applied to the control terminal of the bias circuit BIAS2 so that the bias circuit BIAS2 performs only the compensation of the current variation due to the channel length modulation effect.

Here will be described an embodiment in which the control voltage Vc for automatically adjusting the transconductance Gm of the amplifier varying with temperature variation and production variation to a desired value can be automatically produced.

Figure 9:
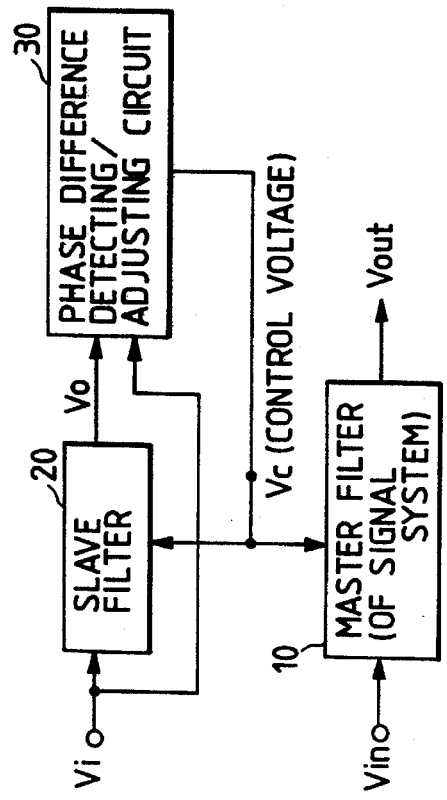
FIG. 9 is a block diagram showing one embodiment of a primary low-pass filter using a Gm-controllable differential amplifier according to the present invention.

As shown in FIG. 9, this embodiment includes an OTA-C filter ( referred to as master filter) 10 used primarily in a signal processing system, a monitoring filter (hereinafter referred to as slave filter) 20 for monitoring a reference signal Vi having a desired frequency, and a phase difference detecting/adjusting circuit 30 for detecting the phase difference between the output Vo of the slave filter 20 and the reference signal Vi to generate a feedback signal. This adjusting circuit 30 generates a feedback signal for adjusting the cut-off frequency fc of the slave filter 20 to a desired value by performing a feedback so that the phase difference may become a desired value (45 degrees). The feedback signal is fed as the Gm– controlling control voltage Vc of the master filter 10 to the master filter 10.

In this embodiment, the slave filter 20 comprises an OTA having the same structure as that of the OTA (a Gm-controllable amplifier) constituting the master filter 10. Thanks to a feature of a semiconductor integrated circuit that the production variations of the transconductance Gm, the temperature characteristics and the capacitance are substantially identical in one semiconductor chip, the cut-off frequency fc of the master filter 10 can be equalized to a desired frequency, i.e., the cut-off frequency fc of the slave filter 20.

Figure 10:
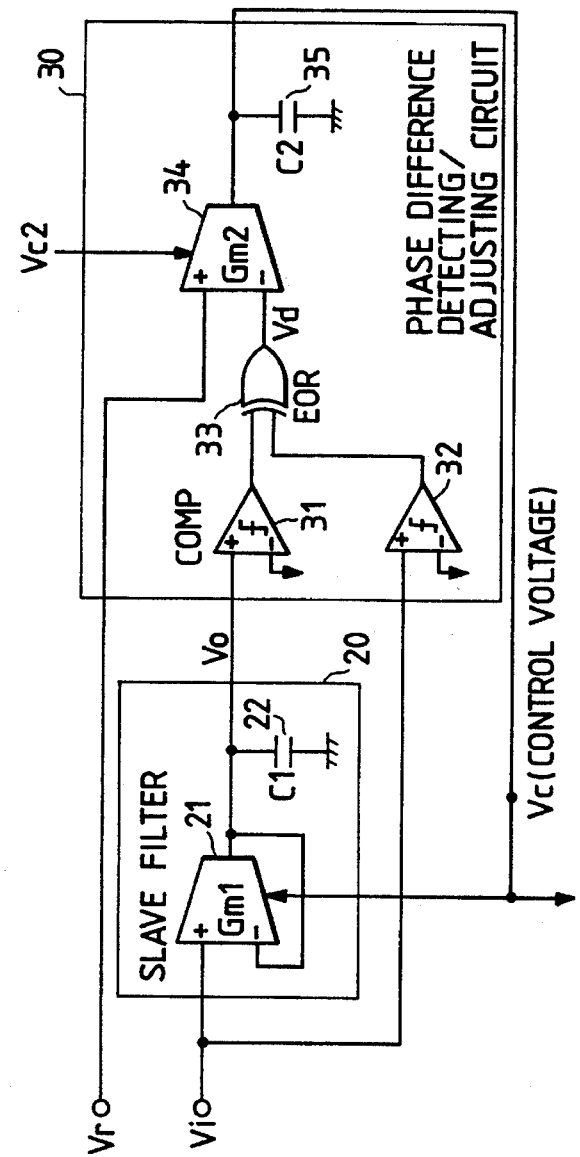
FIG. 10 is a circuit diagram showing one embodiment of a control voltage generator (a slave filter and a phase difference detecting/adjusting circuit) of the embodiment of FIG. 9.

FIG. 10 shows a specific circuit example of the control voltage generator comprising the slave filter 20 and the phase difference detecting/adjusting circuit 30.

Figure 17:
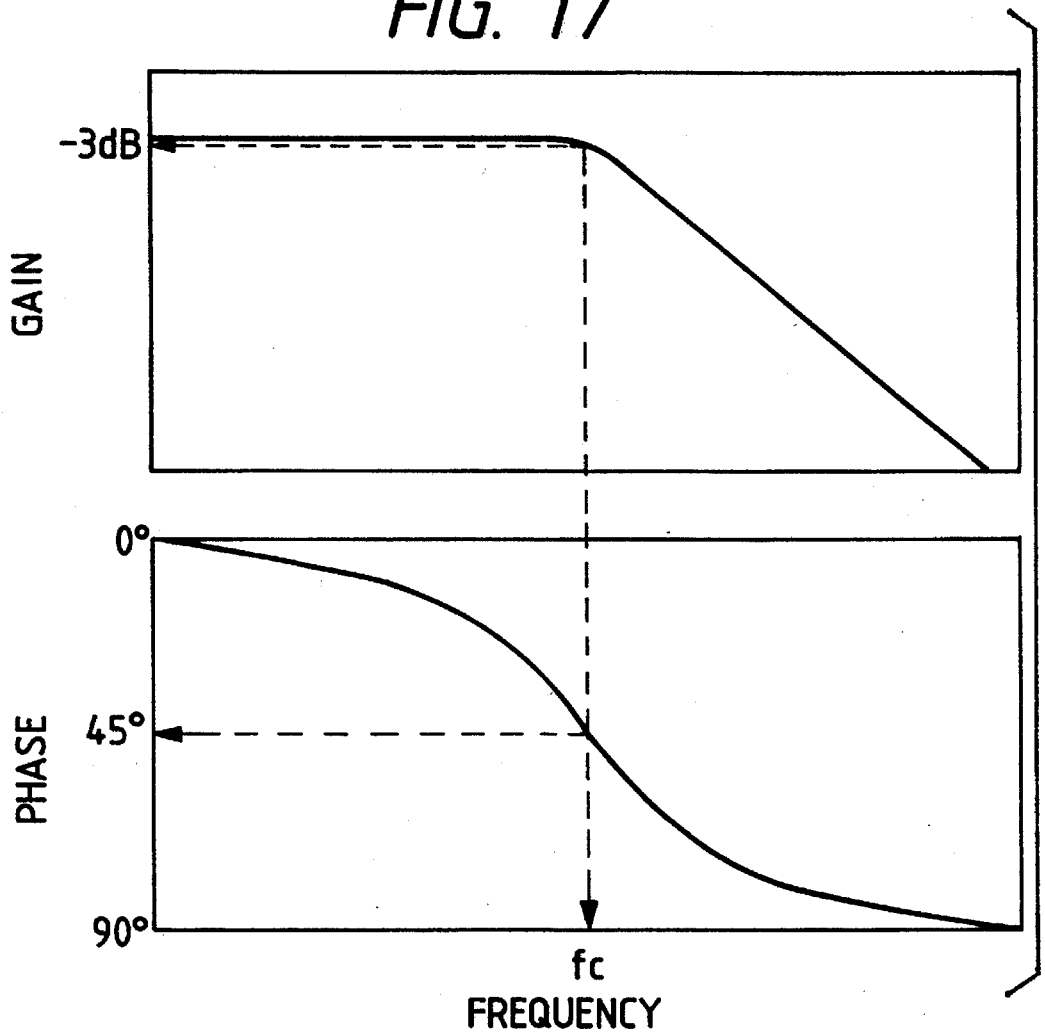
FIG. 17 is an explanatory diagram showing the relation between the cut-off frequency and the phase delay of the primary low-pass filter.
Figure 18:
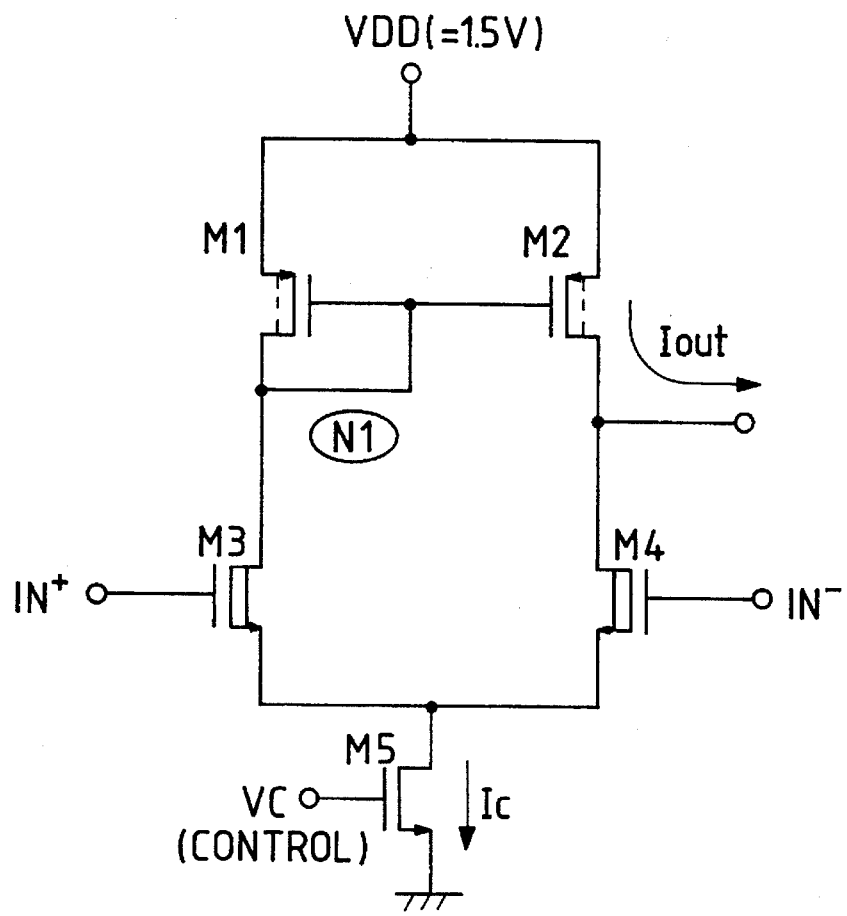
FIG. 18 is a circuit diagram showing one example of a devisable Gm-controllable differential amplifier.
Figure 19:
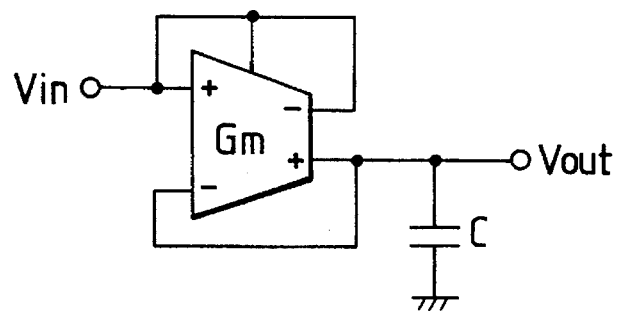
FIG. 19 is a circuit structural diagram showing one example of the primary low-pass filter using the differential amplifier of FIG. 18.

The control voltage generator of this embodiments makes use of the fact that the phase delay of the primary low-pass filter is 45 degrees at the cut-off frequency fc defined by the frequency when the gain is –3 dB (see FIG. 17). That is, the control voltage generator generates the feedback signal (Vc) so that the phase difference becomes 45 degrees by inputting the reference signal having a desired frequency to the slave filter 20 comprising an OTA 21 and a capacitor 22 and by detecting the phase difference between the output Vo of the slave filter 20 and the reference signal Vi by the phase difference detecting/adjusting circuit 30.

In this embodiment, therefore, the phase difference detecting/adjusting circuit 30 comprises comparators 31 and 32 for converting the output Vo of the slave filter 20 and the reference signal Vi to rectangular waves (pulses), an exclusive OR gate 33 for receiving those output pulses to produce pulses Vd having a duty ratio corresponding to the phase difference of the output pulses, and an integrator (an OTA 34 and a capacitor 35) for integrating the difference between the output pulses Vd and an ideal pulse signal Vr having a duty ratio of 25%.

In the control voltage generator of this embodiment, if the cut-off frequency fc of the slave filter 20 is equal to the frequency fi (i.e., fc=fi) of the reference signal Vi, the phase of the output Vo of the slave filter 20 will be delayed by 45 degrees, as has been described before. Thus, the output Vd of the EOR gate 33 has a waveform having a frequency which is twice the frequency of the input reference signal Vi and a duty ratio which is 25 %, or ¼ of that of the input reference signal Vi, as shown in FIG. 11(a).

When, on the other hand, the OTA 21 constituting the slave filter 20 does not have a desired Gm value, the cut-off frequency fc fails to coincide with the frequency fi of the reference signal Vi so that the duty ratio of the output pulse Vd of the EOR gate 33 becomes different from 25%. Since the difference between the pulse Vd and the ideal pulse signal Vr having the duty ratio of 25% is integrated by the integrator, the phase delay is small, as shown in FIG. 11(b), if fc>fi, so that the duty of the pulse Vd is reduced to increase the integrated value, i.e., the output voltage (control voltage).

Figure 11:
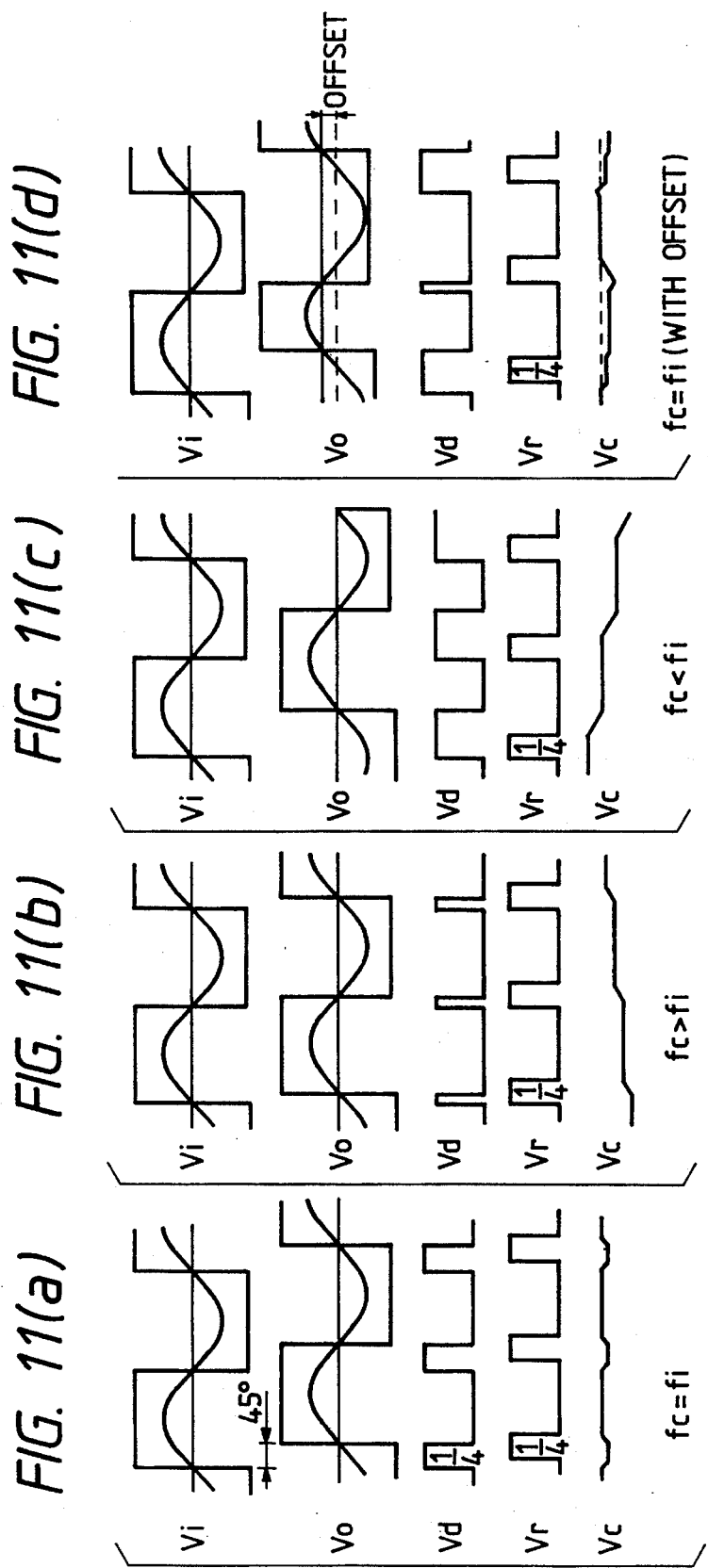
FIG. 11(a) to FIG. 11(d) are waveform explanatory diagrams showing the input/output waveforms of the phase difference detecting/adjusting circuit of the embodiment of FIG. 10 in relation to frequency.

If fc<fi, on the other hand, the phase delay is so large, as shown in FIG. 11(c), that the duty of the pulses Vd is raised to decrease the integrated value, i.e., the output voltage. The transconductance Gm of the OTA 21 constituting the slave filter 20 is adjusted by this output voltage (the control voltage Vc). Negative feedback is applied in such a manner that the cut-off frequency fc of the slave filter 20 is raised when the control voltage Vc drops, but lowered when the control voltage Vc rises. As a result, in a steady state, an automatic adjustment is made to maintain fc=fi. Since this control voltage Vc is also fed to the master filter 10, the cut-off frequency fc of the master filter 10 is also controlled to the frequency fi of the reference signal Vi. Moreover, the cut-off frequency after the automatic adjustment can be arbitrarily set by changing the duty ratio of the ideal pulse signal Vr.

In the control voltage generator of this embodiment, in order to stabilize the output voltage Vc, it is necessary to make the time constant of the integrator larger than that of the slave filter 20. However, quicker convergence to the steady state can be achieved for the smaller time constant of the integrator. In this embodiment, therefore, the transconductance Gm of the OTA 34 can be increased during the transition to lower the constant of the integrator but is decreased after the transition to raise the constant of the integrator by controlling the control voltage Vc2 of the OTA 34 constituting the integrator.

Incidentally, in cases where a plurality of signal processing systems, i.e., two or more master filters are provided on a single semiconductor chip, a control voltage generator of the embodiment can be provided commonly for the two master filters thereby to feed the control voltage Vc from one control voltage generator to each of the master filters.

Since only a single integrator is provided in the loop, the control voltage generator of this embodiment has an advantage that the system operation is stabilized. The generator has also another advantage that the integrated value is constant, as shown in FIG. 11(d), not influencing upon the accuracy even if the OTAs 21 and 34 and the comparators 31 and 32 are offset.

Figure 12:
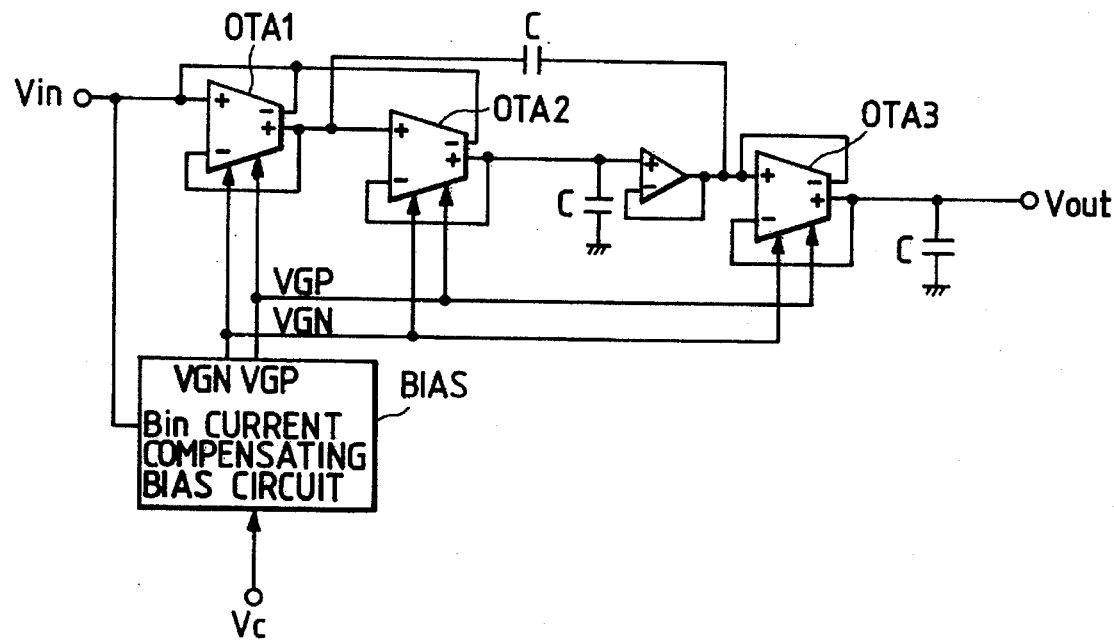
FIG. 12 is a block diagram showing one embodiment of a ternary low-pass filter using a Gm-controllable differential amplifier according to the present invention.

FIG. 12 shows another embodiment of the OTA-C filter according to the present invention. The OTA-C filter shown in FIG. 12 is formed on a single semiconductor substrate.

The filter circuit of FIG. 12 is an application of the present invention to a ternary Butterworth low-pass filter. In FIG. 12, each of the OTA1, OTA2 and OTA3 is a Gm-controllable differential amplifier having the same circuit structure as that of the differential amplifying stage OTA shown in FIG. 5. In each OTA, a bias voltage VGN for the constant current MOSFET M5 and a bias voltage VGP for the MOSFETs M1 and M2 are fed from the common current compensation type bias circuit BIAS. The inverted output terminals of the differential amplifying stage OTA1 and OTA2 are connected to the input terminal Vin having a low impedance, and the inverted output terminal of the differential amplifying stage OTA3 is connected to the input terminal of the OTA3 having a low impedance.

Figure 14:
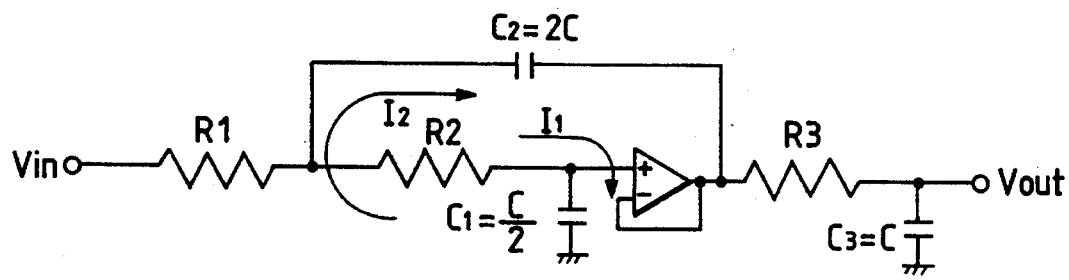
FIG. 14 is a block diagram showing one example of a ternary CR low-pass filter of the prior art.

Incidentally, the filter circuit of FIG. 12 is a further improvement over the OTA-C filter in which resistors R1, R2 and R3 in the Sallen-Key type low-pass filter shown in FIG. 14 are replaced by OTAs (a Gm-controllable differential amplifiers).

Figure 15:
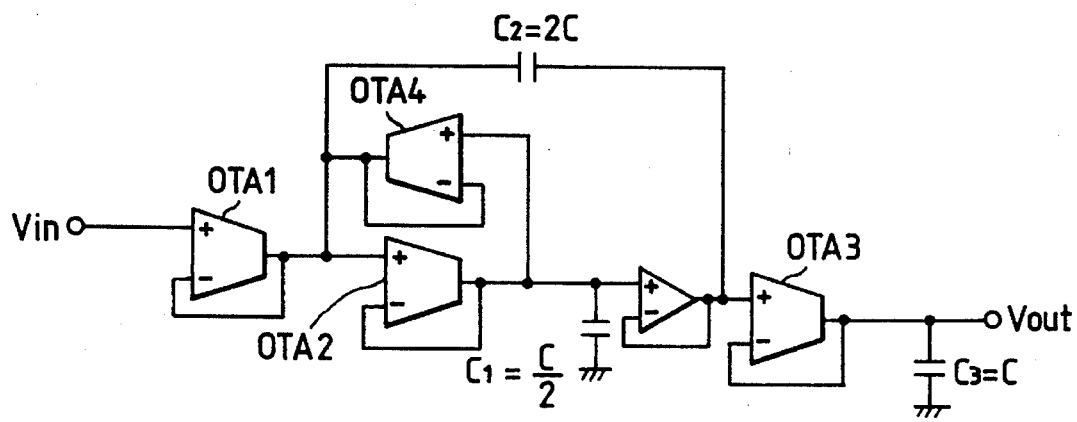
FIG. 15 is a block diagram showing a circuit example in cases where the resistors in the CR low-pass filter of FIG. 14 are simply replaced by the Gm-controllable differential amplifier according to the present invention.

In other words, the circuit, as shown in FIG. 15 is obtained, when the resistors R1, R2 and R3 in the Sallen- Key type filter shown in FIG. 14 are merely replaced by OTAs. Here, the reason why the resistor R2 is replaced by two OTAs is that an amplifier OTA2 for charging/discharging a capacitor $C_1$ and an amplifier OTA4 for charging/discharging a capacitor $C_2$ are required because there are two cases where through the resistor R2, a current $I_1$ for charging the capacitor $C_1$ and a current $I_2$ for charging the capacitor $C_2$ flow. It has been found out that an identical transmission function can be achieved even if the amplifier OTA of FIG. 15 is omitted, by selecting proper ratios of capacitances $C_1$, $C_2$, and $C_3$ ($C_1=C_2=C_3$ in the case of the ternary Butterworth) of the circuit of FIG. 14. Therefore, we have deviced an improved OTA-C filter, as the embodiment in FIG. 12.

The OTA-C filter, as has been examined, uses a completely differential type amplifier. Since, in this case, a high voltage is applied between the inverting input terminal and the non-inverting input terminal, the linearity of the voltage/current conversion characteristics of the OTA, as it is, represents the linearity of the filter so that the OTA is required to have an extremely high linearity. In the OTA-C filter of the embodiment, on the contrary, a single-ended output amplifier is used, and so the OTA-C filter has an advantage that such an extremely high linearly is not required of the OTA.

Figure 13:
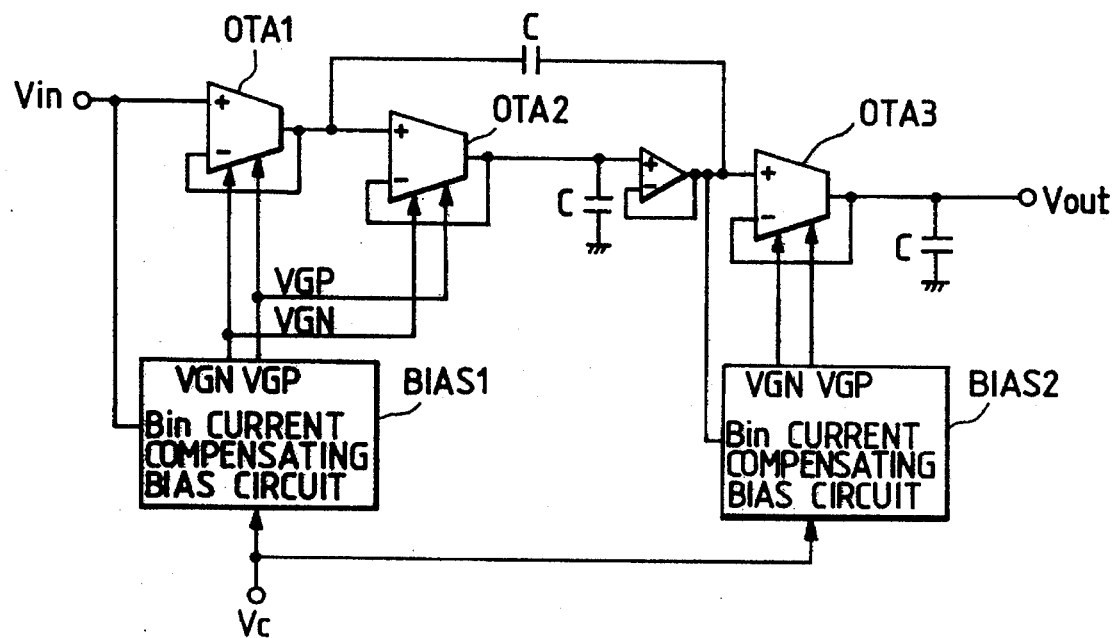
FIG. 13 is a block diagram showing another embodiment of a ternary low-pass filter using a Gm controllable differential amplifier according to the present invention.

Incidentally, the OTA-C filter of FIG. 12 has a structure such that the amplifies OTA1, OTA2 and OTA3 are supplied with the bias voltages VGN and VGP from the common current compensation type bias circuit BIAS respectively, but the input voltage to the amplifier OTA3 is different in level from the input voltages to the amplifiers OTA1 and OTA2. As shown in FIG. 13, therefore, there are provided the different current compensation type bias circuits BIAS1 and BIAS2 for feeding the bias voltages VGN and VGP with respect to which the currents are compensated according to the respective input voltages, so that the distortion can be further reduced. In this case, the bias circuit BIAS2 is fed with the input of the OTA3. Moreover, the bias circuits BIAS, BIAS1 and BIAS2 of FIGS. 12 and 13 have the same structure as that of the bias circuit BIAS of FIG. 5.

Figure 16:
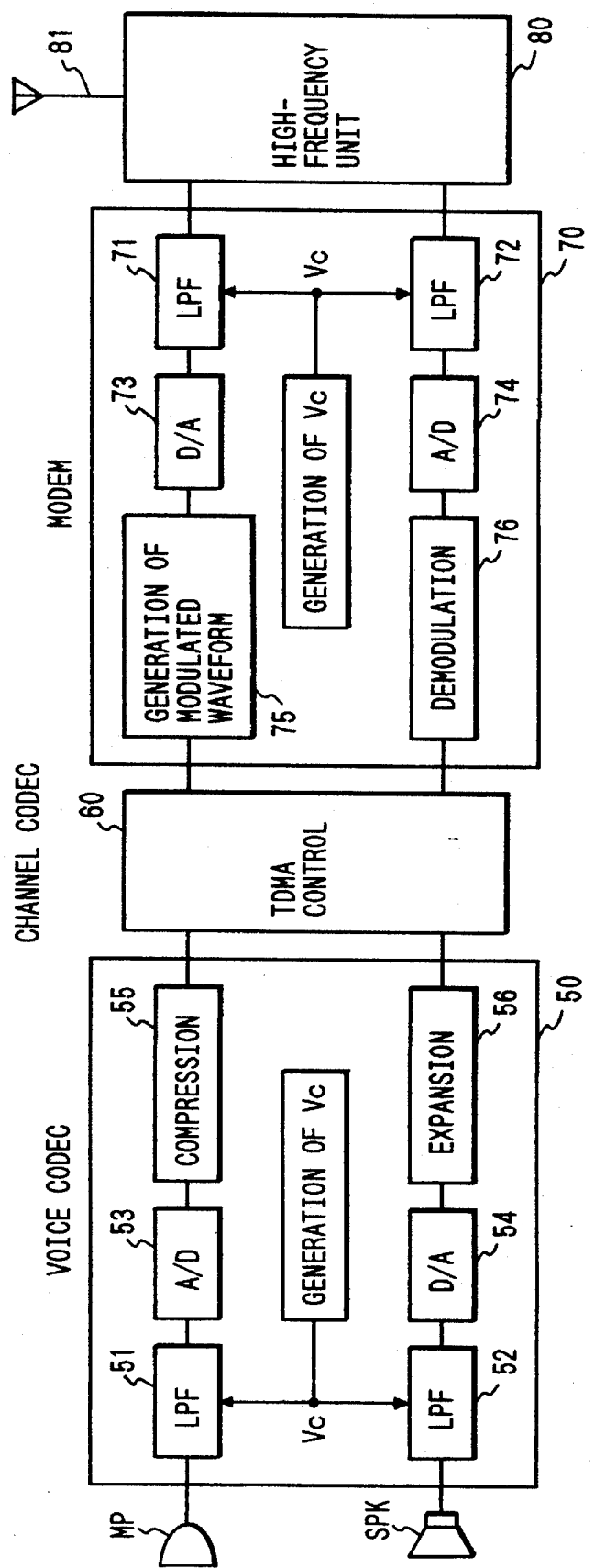
FIG. 16 is a block diagram showing an example of the construction of a radio communication system as an application example of the filter circuit according to the present invention.

FIG. 16 shows a radio communication system as an application example of the filter circuit (low-pass filter) shown in FIG. 14.

In FIG. 16, reference numeral 50 designates a voice codec connected to a microphone MP and a speaker SPK for effecting conversions of an audio signal to an electric signal and of an analog signal to a digital signal; numeral 60 designates a channel codec circuit for performing time shared processing, for generating and checking error correcting codes and for forming and analyzing a transmission/reception frame; and numeral 70 designates a modem (modulating/demodulating circuit) for modulating/demodulating a transmitted/received signal.

The voice codec 50 comprises low-pass filters 51 and 52, an A/D converter 53, a D/A converter 54, a coder 55 for compressing an input audio signal, and a decoder 56 for expanding an audio output. Moreover, the modem 70 comprises low-pass filters 71 and 72, a D/A converter 73, an A/D converter 74, a modulator 75 and a demodulator 76. The voice codec 50, channel codec circuit 60 and modem (modulator/demodulator) 70 are formed on one semiconductor chip and integrated into one semiconductor integrated circuit, although not especially limited thereto.

Incidentally, in FIG. 16, numeral 80 designates a high-frequency unit comprising of a power amplifier for transmission, a synthesizer for generating a carrier signal, and an adder for combining the carrier signal with the transmission/reception signal, and numeral 81 designates a transmitting/receiving antenna.

In this embodiment, as the low-pass filters 51 and 52, and 71 and 72, the filter circuits shown in FIG. 12 or 13 are used, and the voice codec 50 and the modem 70 have therein Gm control circuits which include Vc generators, as shown in FIG. 10, for generating the control voltages Vc to control the transconductances Gm of the OTAs (the Gm-controllable differential amplifiers) constituting the low-pass filters 51 and 52, and 71 and 72.

Moreover, the Gm control circuit in the voice codec 50 is provided commonly for the low-pass filters 51 and 52, and the Gm control circuit in the modem 70 is provided commonly for the low-pass filters 71 and 72. Since the ratios of the capacitive elements and the resistance elements on the same semiconductor chip can be set relatively accurate, the transconductances of the OTAs and the cut-off frequencies of the filter can be accurately controlled to constants even if the Gm-control circuits are commonly provided for a plurality of filter circuits on a single chip. Moreover, an increase in the occupied area can be suppressed by making the Gm control circuit common, as in the embodiment.

In the embodiments, as has been described above, the Gm-controllable amplifier used in an OTA-C filter has a structure that the constant voltage from the bias circuit is applied to the gates of the load MOSFETs connected to the drains of the input differential MOSFETs of the basic differential amplifier to cause the load MOSFETs to operate as constant current sources and the inverted output terminal of the circuit is connectd to the input terminals. As a result, the load MOSFETs of the input differential MOSFETs are made to serve as constant current sources so that the drain voltages of the input differential MOSFETs become independent of the threshold voltage of the load MOSFETs. Even if the supply voltage VDD is set to as low as about 1.5 V, the input differential MOSFETs can be prevented from being unsaturated when the input signals rise, providing a low-voltage amplifier. Since, moreover, the inverted output terminals are coupled to the input terminals, the currents outputted from the inverted output terminals and flowing in the direction opposite to that of the current from the non-inverted output terminals can be absorbed from the non-inverting input terminals, to produce an effect that the balance of the circuit can be easily held.

Moreover, the basic differential amplifier is equipped with a current compensation type bias generator for generating a bias voltage according to the level of an input voltage monitored, and feeding the bias voltage to the gates of the constant current MOSFETs of the basic differential amplifier so as to compensate the current fluctuation due to the channel length modulation effect. As a result, the bias current of the differential amplifier becomes constant to raise an effect that the transconductance can be stabilized and the output distortion can be reduced.

The OTA, as described in this specification, can be deemed as a circuit for converting the input differential voltage to a current. In short, the OTA can be deemed as a differential-voltage/current converter.

Although our invention has been specifically described in connection with its embodiments, it should not be limited thereto but can naturally be modified in various manners without departing from the gist thereof. Although in the foregoing embodiments, by the primary low-pass filter and the ternary low-pass filter are shown, the present invention can also be applied to a secondary low-pass filter and a quartic or higher order low-pass filter. Moreover, the present invention can be used in a band-pass filter or a high-pass filter.

The effects obtained by the representative of the inventions disclosed herein will be briefly described in the following.

It is possible to realize a filter circuit which operates on a low voltage with a low power consumption, and has a low distortion and a small frequency deviation.

The characteristics of the OTA-C filter circuit can be relatively greatly changed, for example, by changing the value of the capacitive element C shown in FIG. 2, by changing the sizes of the MOSFETs M1 to M5 of the OTA shown in FIG. 1, or by changing the both. In this case, the characteristics may be finely adjusted by changing the value of the control voltage Vc. In cases where the ease of the design is considered, it is preferable to change the value of the capacitive element C. The variation of the characteristics due to the production variation may naturally be adjusted by adjusting the control voltage Vc.

What is claimed is:

1. An analog filter circuit comprising:

a voltage/current conversion circuit having an inversion input node, a non-inversion input node for receiving an input voltage signal, an inversion output node and a non-inversion output node coupled to the inversion input node, and including:

a first differential MOSFET having a source, a drain providing a first output signal to the inversion output node and a gate receiving a first input signal from the non-inversion input node:

a second differential MOSFET having a source connected to the source of said first differential MOSFET, a drain providing a second output signal to the non-inversion output node and a gate receiving a second input signal from the inversion input node;

a current source connected to the source of said first differential MOSFET;

a first current circuit connected between a power supply terminal to which a predetermined voltage is applied and the drain of said first differential MOSFET; and a second current circuit connected between said power supply terminal and the drain of said second differential MOSFET;

a capacitance circuit connected to the non-inversion output node of said voltage/current conversion circuit; and a control circuit connected to the first current circuit and the second current circuit of said voltage/current conversion circuit, and used to determine the current values of the first and second current circuits.

2. An analog filter circuit according to claim 1, wherein said first current circuit is a third MOSFET having a source-drain path connected between said power terminal and the drain of said first MOSFET, and a gate, said second current circuit is a fourth MOSFET having a source-drain path connected between said power supply terminal and the drain of said second MOSFET, and a gate, and said control circuit is a bias circuit for changing the bias voltage applied to the gates of said third and fourth MOSFETs in accordance with a control signal.

3. An analog filter circuit according to claim 2, wherein said current source is a fifth MOSFET having a source-drain path connected between the source of said first MOSFET and a predetermined power supply terminal, and a gate, and said control circuit includes a bias circuit for changing a bias voltage applied to the gate of said fifth MOSFET in accordance with said control signal.

4. An analog filter circuit according to claim 2, wherein said control signal includes a signal corresponding to an input signal fed to the gate of said first MOSFET, and said bias circuit includes a compensation circuit for feeding the gates of said first and second MOSFETs with a bias voltage which compensates the change in the source-drain currents of said first and second MOSFETs with the change in the voltages at the drains of said first and second MOSFETs due to the change in said input signal.

5. An analog filter circuit according to claim 3, wherein said control signal includes a signal corresponding to an input signal fed to the gate of said first MOSFET, and said bias circuit includes a first compensation circuit for feeding the gates of said first and second MOSFETs with a bias voltage which compensates the change in the source-drain currents of said first and second MOSFETs with the change in the voltages at the drains of said first and second MOSFETs due to the change in said input signal; and a second compensation circuit for feeding the gate of said fifth MOSFET with a bias voltage which compensates the change in the source-drain current of said fifth MOSFET with the change in the voltage at the drain of the fifth MOSFET due to the change in said input signal.

6. An analog filter circuit according to claim 1, wherein said current source is a sixth MOSFET having a source-drain path connected between the source of said first MOSFET and a predetermined power supply terminal, and a gate, and said control circuit includes a bias circuit for changing a bias voltage fed to the gate of said sixth MOSFET in accordance with said control signal.

7. An analog filter circuit according to claim 6, wherein said control signal includes an input signal according to the input voltage signal, and said bias circuit includes a compensation circuit which changes a voltage at the gate of the fifth MOSFET in accordance with the input signal included in the control signal, to compensate for a change in the drain of the fifth MOSFET due to a change in the input voltage signal.

8. An analog filter circuit according to claim 1, wherein said analog filter circuit is a filter circuit built in an audio codec or modem.

9. An analog filter circuit according to claim 1, wherein the inversion output node of the voltage/current conversion circuit is coupled to the non-inversion input node of the voltage/current conversion circuit.

10. An analog filter circuit according to claim 9, wherein the first current circuit is a third MOSFET having a source-drain path connected between the power terminal and the drain of the first MOSFET, and having a gate, the second current circuit is a fourth MOSFET having a source-drain path connected between the power supply terminal and the drain of the second MOSFET, and having a gate, and the control circuit includes a bias circuit which changes a bias voltage applied to the gate of the third MOSFET and to the gate of the fourth MOSFET in accordance with a control signal.

11. An analog filter circuit according to claim 10, wherein the current source is a fifth MOSFET having a source-drain path connected between the source of the first MOSFET and a predetermined power supply terminal, and having a gate, and the control circuit includes a bias circuit which changes a bias voltage applied to the gate of the fifth MOSFET in accordance with said control signal.

12. An analog filter circuit according to claim 11, wherein said control signal includes an input signal according to the input voltage signal, and said bias circuit includes a compensation circuit which changes a voltage at the gate of the fifth MOSFET in accordance with the input signal included in the control signal, to compensate for a change in the drain of the fifth MOSFET due to a change in the input voltage signal.

13. An analog filter circuit according to claim 9, wherein the current source is a third MOSFET having a source-drain path connected between the source of the first MOSFET and a predetermined power supply terminal, and having a gate, and the control circuit includes a bias circuit which changes a bias voltage applied to the gate of the third MOSFET in accordance with a control signal.

14. An analog filter circuit formed on a single semiconductor substrate and comprising a voltage/current conversion circuit and a capacitive element connected to the output of said voltage/current conversion circuit, wherein said voltage/current conversion circuit includes:

first, second, third and fourth differential MOSFETs whose sources are commonly connected;

a first current source connected to the drains of said first and third differential MOSFETs;

a second current source connected to the drains of said second and fourth differential MOSFETs;

a first level shift circuit connected to the gates of said first and second differential MOSFETs;

a second level shift circuit connected to the gates of said third and fourth differential MOSFETs;

a first level-up circuit for raising an input signal received, and feeding the level-up signal to said first level shift circuit; and a second level-up circuit for raising an input signal received, and feeding the level-up signal to said second level shift circuit.

15. An analog filter circuit according to claim 14, wherein said first level-up circuit includes a fifth MOSFET for a source follower which receives said input signal;

said second level-up circuit includes a sixth MOSFET for a source follower which receives said input signal;

said first level shift circuit includes seventh and eighth MOSFETs having substantially the same characteristics as those of said fifth MOSFET, said seventh MOSFET is diode-connected and feeds the output of said first level-up circuit to said first differential MOSFET, and said eighth MOSFET is diode-connected and feeds the output of said first level-up circuit to said second differential MOSFET, and said second level shift circuit includes ninth and tenth MOSFETs having substantially the same characteristics as those of said sixth MOSFET, said ninth MOSFET is diode-connected and feeds the output of said second level-up circuit to said third differential MOSFET, and said tenth MOSFET is diode-connected and feeds the output of said second level-up circuit to said fourth differential MOSFET.

16. An analog filter circuit according to claim 15, wherein said first level shift circuit further includes a variable current source connected to the sources of said seventh and eighth MOSFETs, and said second level shift circuit further includes a variable current source connected to the sources of said ninth and tenth MOSFETs.

17. An analog filter circuit according to claim 14, wherein said analog filter circuit is a filter circuit built in an audio codec or modem.

18. A semiconductor integrated circuit device formed on a single semiconductor substrate and including a filter circuit, comprising:

a first filter circuit having a control terminal, an input terminal and an output terminal and having characteristics changed by a control signal applied to said control terminal;

a phase difference detector which receives a reference output signal outputted from said first filter circuit and a reference signal having a predetermined phase and outputs the control signal on the basis of said reference output signal and said reference signal; and a second filter circuit having a control terminal; an input terminal and an output terminal and having characteristics changed by the control signal fed to said control terminal, wherein said phase difference detector includes a phase difference detecting circuit which receives an input signal for the first filter circuit and the reference output signal and which outputs a phase signal having a phase in accordance with a difference between the input signal and the reference output, and a control signal generating circuit generating the control signal in accordance with difference between the reference signal and the phase signal in phase, wherein each of the first filter circuit and the second filter circuit includes:

a voltage/current conversion circuit having an inversion input node, a non-inversion input node coupled to the input terminal, an inversion output node and a non-inversion output node coupled to the inversion input node and to the output terminal, and including:

a first differential MOSFET having a source, a drain providing a first output signal to the inversion output node and a gate receiving a first input signal from the non-inversion input node;

a second differential MOSFET having a source connected to the source of said first differential MOSFET, a drain providing a second output signal to the non-inversion output node and a gate receiving a second input signal from the inversion input node;

a current source connected to the source of said first differential MOSFET;

a first current circuit connected between a power supply terminal to which a predetermined voltage is applied and the drain of said first differential MOSFET; and a second current circuit connected between said power supply terminals and the drain of said second differential MOSFET;

a capacitance circuit connected to the non-inversion output node of said voltage/current conversion circuit; and a control circuit coupled to the first current circuit, to the second current circuit of said voltage/current conversion circuit and to the control terminal, and used to determine the current values of the first and second current circuits.

19. A semiconductor integrated circuit device according to claim 18, wherein the inversion output node of the voltage/current conversion circuit is coupled to the non-inversion input node of the voltage/current conversion circuit.

20. A semiconductor integrated circuit device according to claim 19, wherein the first current circuit is a third MOSFET having a source-drain path connected between the power terminal and the drain of the first MOSFET, and a gate, the second current circuit is a fourth MOSFET having a source-drain path connected between the power supply terminal and the drain of the second MOSFET, and a gate, and the control circuit includes a bias circuit which changes a bias voltage applied to the gate of the third MOSFET and to the gate of the fourth MOSFET in accordance with the control signal.

21. A semiconductor integrated circuit device according to claim 20, wherein the current source is a fifth MOSFET having a source-drain path connected between the source of the first MOSFET and a predetermined power supply terminal, and a gate, and the control circuit includes a bias circuit which changes a bias voltage applied to the gate of the fifth MOSFET in accordance with said control signal.

* * * * *